United States Patent [19]
Alphonse et al.

[11] Patent Number: 6,034,380
[45] Date of Patent: Mar. 7, 2000

[54] ELECTROLUMINESCENT DIODE WITH MODE EXPANDER

[75] Inventors: Gerard Argant Alphonse, Princeton; James T. Andrews, Hopewell, both of N.J.; Raymond J. Menna, Newtown, Pa.

[73] Assignee: Sarnoff Corporation, Princeton, N.J.

[21] Appl. No.: 08/946,180

[22] Filed: Oct. 7, 1997

[51] Int. Cl.[7] .................................................. H01L 33/00
[52] U.S. Cl. ................................ 257/94; 257/96; 372/45; 372/46
[58] Field of Search ................................. 257/94, 96, 98, 257/103; 372/45, 46, 50

[56] References Cited

U.S. PATENT DOCUMENTS

| | | | |
|---|---|---|---|
| 4,789,881 | 12/1988 | Alphonse | 357/17 |
| 4,793,679 | 12/1988 | Toda et al. | 350/96.15 |
| 4,821,276 | 4/1989 | Alphonse et al. | 372/45 |
| 4,821,277 | 4/1989 | Alphonse et al. | 372/45 |
| 4,958,355 | 9/1990 | Alphonse et al. | 372/45 |

Primary Examiner—Minh Loan Tran
Attorney, Agent, or Firm—William J. Burke

[57] ABSTRACT

A semiconductor electro luminescent diode having a body of a semiconductor material with the body having a pair of spaced opposed end surfaces, side surfaces and top and bottom surfaces. The body includes therein an active layer which extends from one end surface to a point spaced from the other end surface. The active layer is of a width narrower than the distance between the side surfaces. Also, the active layer has a portion adjacent the other end surface of the body which is tapered to come to a point. First clad layers of a material having an index of refraction smaller than that of the active layer are at opposite sides of the active layer and extend between the end of the active layer and the other end surface of the body. Second clad layers of a material having an index of refraction larger than that of the first clad layers but less than the index of refraction of the active layer are on the first clad layer. Radiation generated in the active layer and emitted from the pointed end of the active layer extends in area in the portion of the second clad layer between the pointed end of the active layer and the other end of the body so that the area of the beam of radiation emitted from the -diode is larger than the area of the beam formed in the active layer.

22 Claims, 3 Drawing Sheets

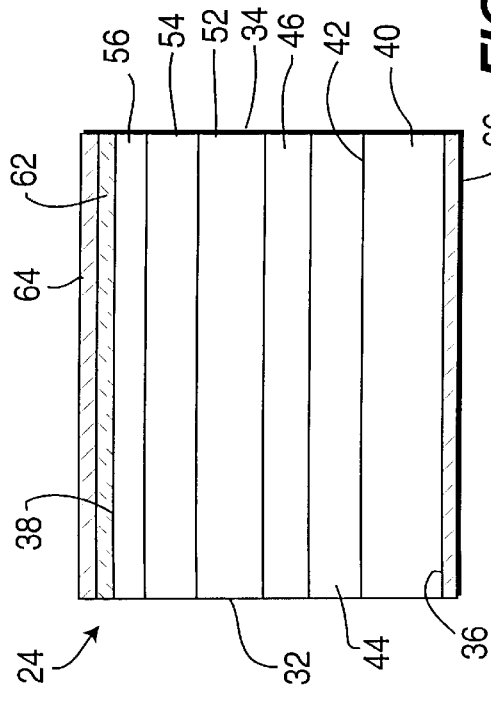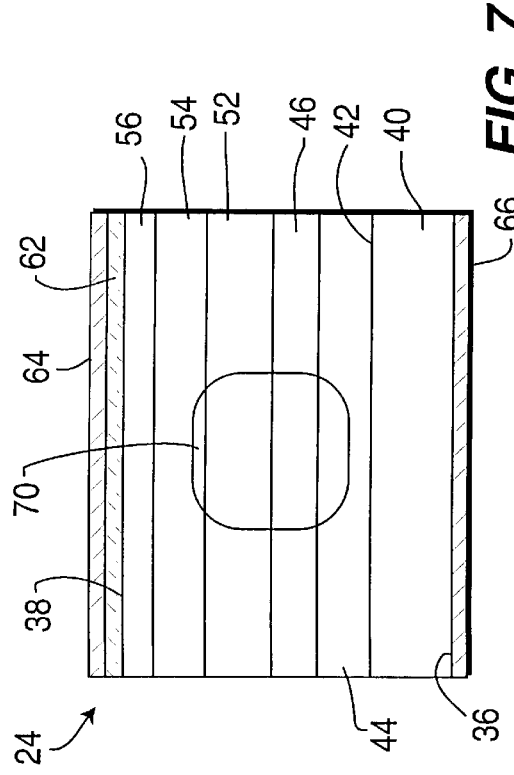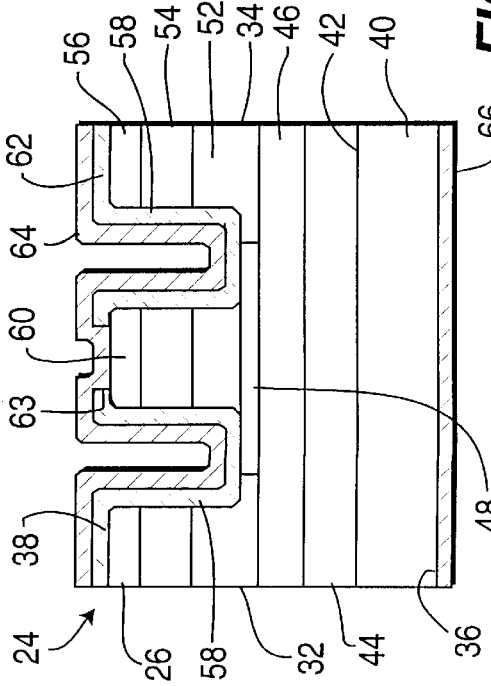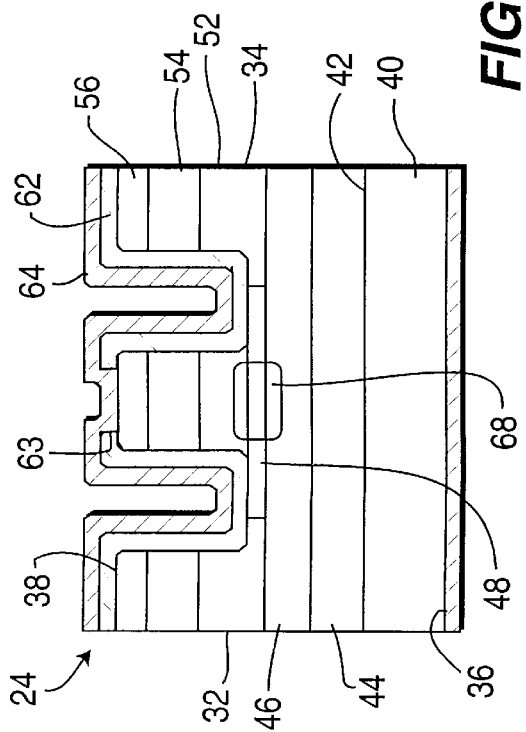

ELECTROLUMINESCENT DIODE WITH MODE EXPANDER

The United States Government has certain rights in the invention under Contract No. DAAH01-95-C-R173 awarded by DARPA.

FIELD OF THE INVENTION

The present invention is directed to an electroluminescent diode having an integrated mode expander, and, more particularly to a semiconductor laser or superluminescent diode (SLD) having a mode expander to allow more efficient coupling to an optical fiber.

BACKGROUND OF THE INVENTION

High power superluminescent diodes (SLD) have applications in fiber optic gyroscopes (FOG), optical amplifiers, external cavity lasers, tunable laser, mode-locked lasers, and in general, as light sources for applications requiring low coherence, such as low coherence interferometers (for fault detection and certain medical instrumentation and imaging). In such uses, it is often necessary to couple the output of the diode into an optical fiber, particularly a single mode optical fiber. Thus, it is desirable to be able to control the size and divergence angle of the emitted beam of radiation so that it can be easily coupled into the optical fiber.

SUMMARY OF THE INVENTION

A semiconductor electroluminescent diode includes a body of a semiconductor material having a pair of spaced end surfaces at least one of which is a radiation emitting surface. The body has therein an active region in which radiation is generated and which serves as a waveguide. The active region has an end spaced from the radiation emitting end surface of the body. A first clad region is in the body and is around the active region so that it extends between the end of the active region and the emitting end surface of the body. A second clad region is between the first clad region and at least a portion of the active region. The first clad region is of a material having an refractive index smaller than that of the active region, and the second clad region is of a material having a refractive index larger than that of the first clad region

BRIEF DESCRIPTION OF THE DRAWINGS

FIG. 4 is a transverse cross-sectional view taken along line 4—4 of FIG. 2;

FIG. 5 is an end view of the SLD at its emitting end;

FIG. 6 is a view similar to FIG. 4 showing the optical mode at that section;

FIG. 7 is a view similar to FIG. 5 showing the optical mode at that end;

DETAILED DESCRIPTION

Figure 1:
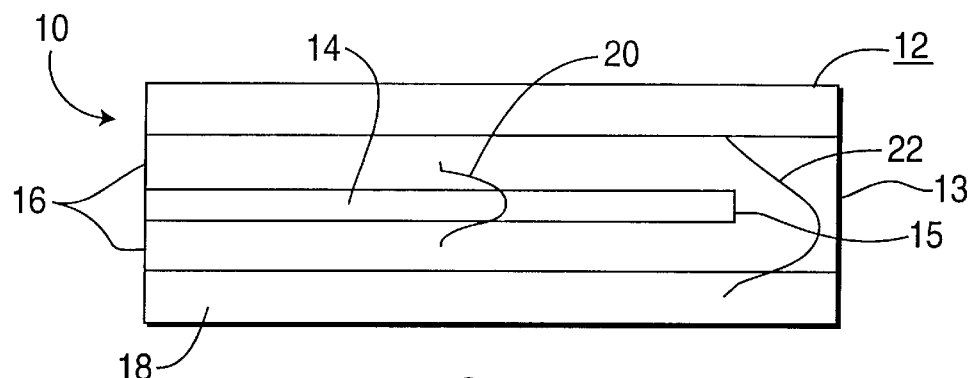
FIG. 1 is a schematic sectional view illustrating the basic structure of the diode of the present invention.

Referring initially to FIG. 1, there is shown schematically an electroluminescent diode 10 which incorporates the present invention. Diode 10 comprises a body 12 of a semiconductor material having a radiation emitting end surface 13. The body 12 also has therein an active region 14 which also serves as a waveguide. The active region 14 is narrow and substantially in the form of fiber. The active region 14 does not extend the full length of the body 12 but has an end 15 which is spaced from the emitting end surface 13 of the body 12. Around the active region 14 is a clad region 16 of a semiconductor material having a lower refractive index than the material of the active region 14. The active region 16 extends between the end 15 of the active region 14 and the end surface 13 of the body 12. Around the clad region 16 is another clad region 18 of a semiconductor material having a refractive index smaller than that of the clad region 16.

In the operation of the diode 10, radiation is generated in the active region 14 and flows along the waveguide active region 14. As shown by the curve 20, most of the radiation is confined to the waveguide active region 14 by the clad region 16 because of the difference in the refractive indices of the active region 14 and the clad region 16. However, some of the radiation does leak into the clad region 16. At the end 15 of the waveguide active region 14, the radiation is emitted into the clad region 16 which is between the waveguide active region 14 and the end surface 13 of the body 12. The radiation entering the clad region 16 expands out as indicated by the curve 22. However, most the radiation is confined to the clad region 16 by the clad region 18 because of the difference in the refractive indices of the two regions. Thus, the area of the beam of radiation emitted from the end surface 13 of the body 12 is larger than the area of the beam of radiation generated in the active region 14. By making the clad region 16 of the same size as the core of an optical fiber, the radiation emitted from the diode 10 can be easily coupled into the optical fiber. In addition, by having an active region 14 which is relatively narrow, the generated beam of radiation has a relatively high power.

Figure 2:
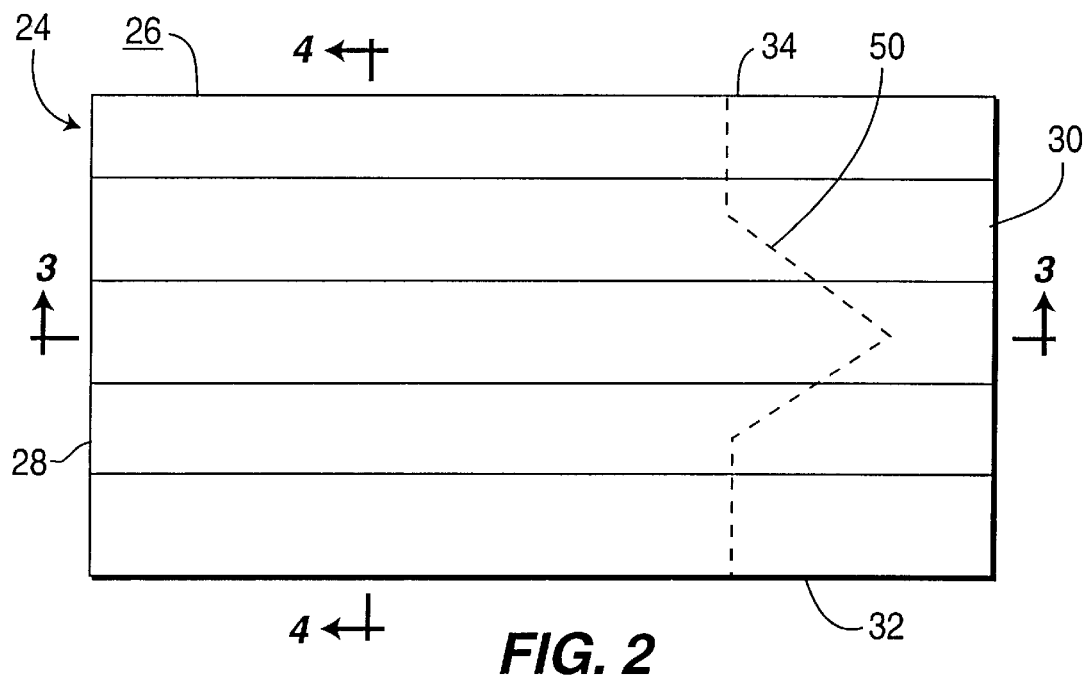
FIG. 2 is a top view of a superluminescent diode (SLD) which incorporates the present invention.
Figure 3:
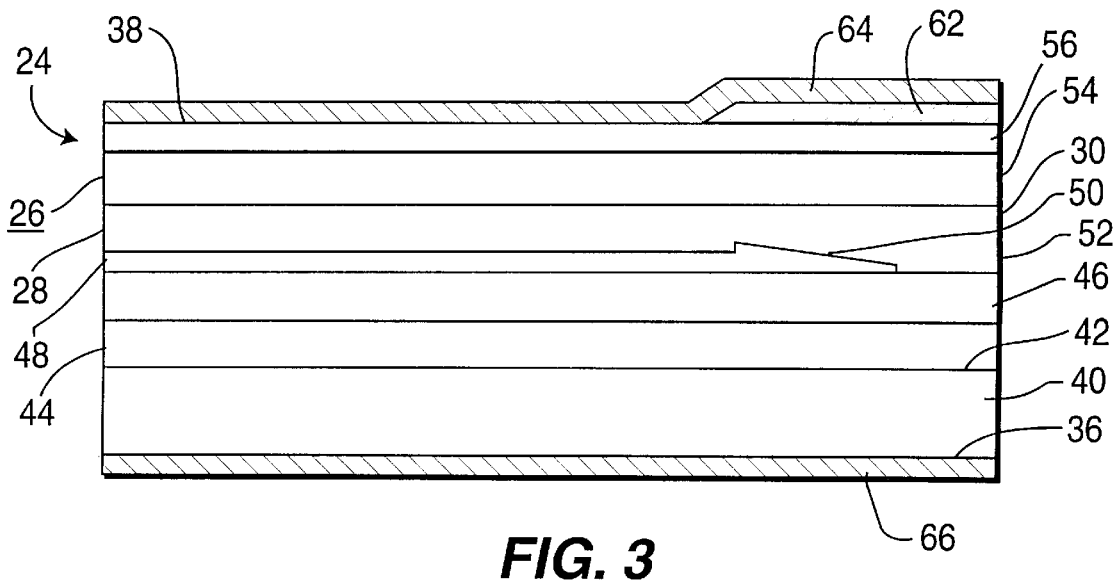
FIG. 3 is a longitudinal cross-sectional view taken along line 3—3 of FIG. 2.

Referring now to FIGS. 2 and 3, one specific form of the electro luminescent diode of the present invention is generally designated as 24. Diode 24 comprises a body 26 of a semiconductor material having opposed end surfaces 28 and 30, opposed side surfaces 32 and 34, a bottom surface 36 and a top surface 38. The body 26 comprises a substrate 40, generally of an n-type conductivity semiconductor material, such as indium phosphide (InP). The substrate 40 has a bottom surface which is the bottom surface 36 of the body 26. The substrate 40 also has a top surface 42 on which is a first clad layer 44. The first clad layer 44 is of n-type conductivity. A second clad layer 46 of n-type conductivity is on the first clad layer 44. The second clad layer 46 is of a semiconductor material having a refractive index which is slightly higher than that of the material of the first clad layer 44. For example, the first and second clad layers 44 and 46 may both be of InGaAsP, but the ratio of the elements in each layer are different to provide the difference in the refractive indices.

On the second clad layer 46 is an active layer 48 of a semiconductor material which is undoped and has a refractive index higher than that of the second clad layer 46. The active layer 48 extends from the end surface 28 of the body 26 to a point spaced from the emitting end surface 30 of the body 26. The active layer is of substantially uniform width from the end surface 28, but is tapered at its free end 50 to a point. Also, as shown in FIG. 3, the active layer 48 is of substantially uniform thickness until its tapered end 50 and then tapers in thickness to the point.

A third clad layer 52 is over the active layer 48 and the portion of the second clad layer 46 which is not covered by the active layer 48. The third clad layer 52 is of the same or similar semiconductor material as the second clad layer 46, but of p-type conductivity. A fourth clad layer 54 is over the third clad layer 52. The fourth clad layer 54 is of the same semiconductor material as the first clad layer 44 except that it is of p-type conductivity. A cap layer 56 of a highly conductive semiconductor material, such as p+ type InGaAs or InP, is over the fourth clad layer 54.

A pair of spaced, parallel grooves 58 extend through the body 26 from the top surface 38 to the active layer 48. Thus, the grooves 58 extend through the cap layer 56, the fourth clad layer 54 and the third clad layer 52 to the active layer 48. The grooves 58 extend longitudinally along the body 26 from the end surface 28 to at least the pointed end 50 of the active layer 48. If desired, the grooves 58 can extend to the emitting end surface of the body. The spacing between the grooves 58 is less than the width of the active layer 48. The grooves 58 define a mesa region 60 therebetween. A layer 62 of an insulating material, such as silicon dioxide, is over the cap layer 56 and the walls of the grooves 58. The insulating layer 62 has an opening 63 therethrough over and along the mesa region 60. A contact layer 64 of a conductive metal is on the insulating layer 62 and in the opening 64 to engage the portion of the cap layer 56 on the mesa region 60. A contact layer 66 of a conductive metal is on the bottom surface 36 of the body 26.

In the operation of the electroluminescent diode 24, a voltage is placed across the body 26 between the contacts 64 and 66. This causes a flow of electrons into the active layer 48 so as to generate radiation in the active region 42. However, the narrow spacing between the grooves 58 define a narrow area in which the electrons flow so that the radiation is generated only in a narrow portion of the active layer 48. Thus, the active layer 48 forms only a narrow waveguide so as to form a narrow beam of the radiation. The beam of radiation is substantially confined to the active layer 48 by the second and third clad layers 46 and 52 which have refractive indices less than that of the active layer 48. As shown in FIG. 6, this forms a beam of radiation 68 the size of which is defined by the thickness of the active layer 48 and the spacing between the grooves 58. However, when the beam of radiation reaches the pointed end 50 of the active layer 48 it is emitted into the portion of the second and third clad layers 46 and 52 which is between the pointed end 50 of the active layer 48 and the emitting end surface 30 of the body 26. The radiation entering the second and third clad layers 46 and 52 expands in size to form a larger beam of radiation 70 as shown in FIG. 7. However, the beam of radiation entering the third clad 52 layer from the pointed end 50 of the active layer 48 is substantially confined to the second and third clad layer 46 and 52 in the direction between the top and bottom surfaces 38 and 36 of the body 26 by the first and fourth clad layers 44 and 54 because of the difference in the refractive indices of the layers. In the direction between the sides surfaces 32 and 34 of the body 26, the radiation expands an amount determined by the angle of the pointed end 50 of the active layer 26. Thus, as shown in FIG. 7, the area of the beam of radiation at the emitting end surface 30 of the body is greater than that of the beam within the active layer 48 but is still confined to a desired size so as correspond to the diameter of an optical fiber which can be placed at the emitting end surface 30 of the body 26.

Figure 8:
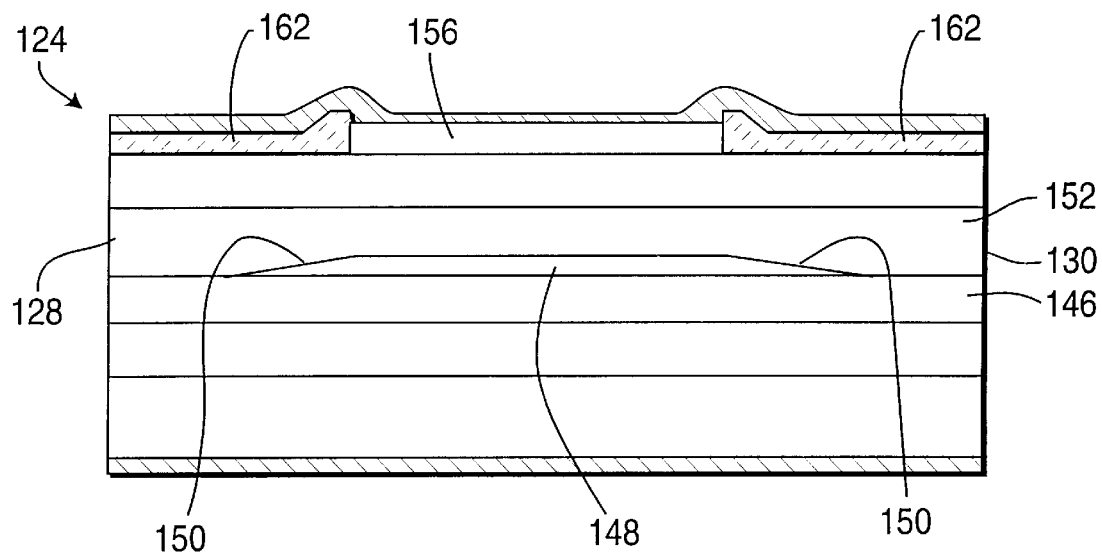
FIG. 8 is a longitudinal cross-sectional view of a modification of the diode of the present invention.

Although the diode 24 has been shown as having a radiation emitting surface at only one end of the body 26, it may having radiation emitting surfaces at both ends of the body. Referring to FIG. 8, there is shown a diode 124 in which both end surfaces 128 and 130 are capable of emitting radiation. In the diode 124, the active layer 148 has ends which are spaced from both of the end surfaces 128 and 130 and has tapered portions 150 at both ends thereof. The third clad layer 152 extends over the active layer 148 and over the portions of the second clad layer 146 not covered by the active layer 148. Thus, in the diode 124, the radiation generated in the active layer 124 can be emitted from both ends thereof into the second and third clad layers 146 and 152 so as to be emitted from each end 128 and 130 of the body 126. The beam of radiation emitted from each end of the active layer 148 will expand in size into the second and third clad layers 146 and 152 as previously described with regard to the diode 24.

A problem which may arise in the diode 24 may be caused by the fact that the highly conductive cap layer 56 extends over the portion of the body 26 beyond the end portion 50 of the active layer 48. Although it is desirable to maintain the flow of current through the diode 24 only across the active layer 48, the highly conductive cap layer 56 can conduct some of the current to the portion of the body 26 beyond the end portion 50 of the active layer 48. To prevent this, the cap layer 156 of the diode 124 shown in FIG. 8 extends only over the length of the active layer 148 and the insulating layer 162 is on the portion of the fourth clad layer 154 which is beyond the ends of the active layer 148. Thus, the flow of current is more definitely confined to the active layer 148.

Figure 9:
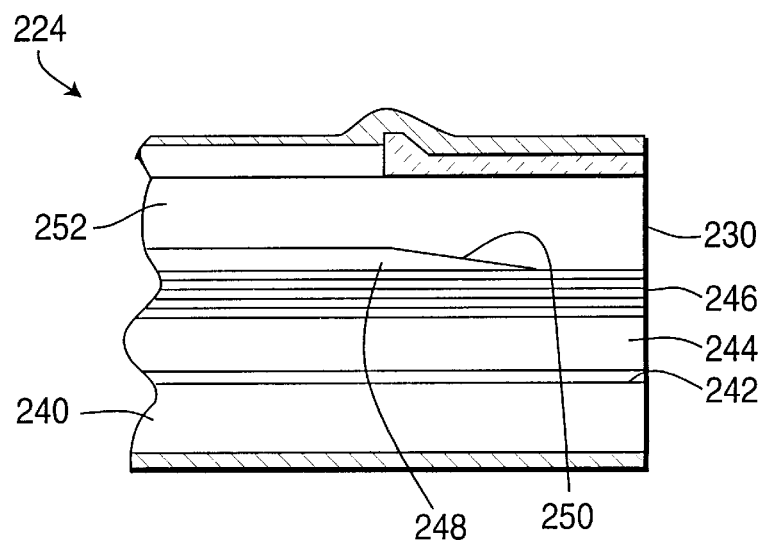
FIG. 9 is a longitudinal cross-sectional view of a portion of still another modification of the diode of the present invention.

In the diode 24 shown in FIG. 2, the radiation emitted from the tapered end of the active layer spreads out into both of the second and third clad layers 46 and 52. Referring to FIG. 9, there is shown a modification 224 of the diode in which the radiation spreads out into only one of the adjacent clad layers. The diode 224 comprises a substrate 240 having on a surface 242 thereof a first clad layer 244. On the first clad layer 244 is a second clad layer 246 of a material having a refractive index which is slightly higher than that of the first clad layer 244. An active layer 248 is on the second clad layer 246 and has a tapered end portion 250 which is spaced from a radiation emitting end surface 230. The active layer 248 is of a material having a refractive index slightly higher than that of the second clad layer 246. The second clad layer 246 can be, for example, a set of alternating layers of the material of the active layer 248 and the first clad layer 244. On the active layer 248 is a third clad layer 252 which extends over the active layer 248 and any portion of the second clad layer 246 not covered by the active layer 248. The third clad layer 252 is of the same material as the first clad layer 244 and has a refractive index substantially the same as that of the first clad layer 244. In the operation of the diode 224, radiation generated in the active layer 248 is emitted from the tapered end 250 thereof. Because of the difference in the refractive indicies of the third clad layer 252 and the active region 248, the radiation emitted from the active region 248 will not spread out into the third clad region 252 but only into the second clad region 246. This further controls the size of the beam of radiation emitted by the diode 224.

Thus, there is provided by the present invention a semi-conductor electroluminescent diode which has a narrow active region so as to achieve high power. Also, the beam of radiation emitted from the end of the active region is expanded in area before it is emitted from the emitting end surface of the diode. The amount that the beam is expanded vertically can be determined by the thickness of the clad layers on each side of the active region. Thus, the beam can be made of a size suitable to provide for more efficient coupling to a fiber optic which may be positioned at the emitting end surface of the diode to as to receive the beam. To form a superluminescent diode (SLD), the active layer and the contact over the active layer should be at an angle of less than 90° with respect to the radiation emitting surface of the diode as is well known in the art. The angle should be such as to provide low spectral modulation from the facet reflection, preferably such that it deviates from 90° by an angle of between 5° and 8°. Although the active layer 48 has been shown as a single layer of undoped semiconductor material, it can be in any well known form for an active layer of an electroluminescent diode. Also, although the layers of the body 26 can be made of any desired semiconductor material depending on the wavelength of the emitted radiation desired. However, no matter what material is used, the relative refractive indices must be maintained. Where the materials desired for use to make the active layer and the outer clad regions have refractive indices which are not close to each other, it may be difficult to find a suitable material to use for the inner clad layers. In such case, it is possible to form at least one of and preferably both of the inner clad layers of multiple alternating layers of the two different materials, with the thickness of the layers and the number of layers providing an inner clad layer having a refractive index close to and between those of the materials of the active layer and the outer clad layer. The inner clad layer can be formed of alternating layers of materials having refractive indices between that of the outer clad layer and that of the active layer. For example, the inner clad layer may be made of alternating layers of the same material as the outer clad layer and a material having a refractive index less than that of the active layer but larger than that of the active layer.

What is claimed is:

1. A semiconductor electroluminescent diode comprising:
    a body of a semiconductor material having a pair of spaced end surfaces at least one of which is a radiation emitting surface;
    an active region within the body which serves to generate radiation and as a waveguide, said active region having an end spaced from the radiation emitting end surface of the body;
    a first clad region within said body and around the active region and between said end of the active region and the radiation emitting surface of said body; and
    a second clad region within said body having a first portion adjacent to a first side of the first clad region and having a second portion adjacent to a second side of the first clad region;
    said first clad region being of a material having a refraction index smaller than that of the material of the active region, and said second clad region being of a material having a refractive index less than that of the first clad region and less than that of the active region.

2. The diode of claim 1 wherein the second clad region extends between the first clad region and the active region completely around the active region and across the end of the active region.

3. The diode of claim 2 in which the width of the active region adjacent the end spaced from the emitting end surface of the body tapers to a point at said end.

4. The diode of claim 3 in which the thickness of the active region tapers in thickness to a point at said end of the active layer.

5. The diode of claim 4 in which the first and second clad layers at one side of the active region are of one conductivity type and the first and second clad layers at the other side of the active region are of the opposite conductivity type.

6. The diode of claim 1 in which the active region has a pair of ends each of which is spaced from a separate one of the end surfaces of the body.

7. A semiconductor electroluminescent diode comprising:
    a body of a semiconductor material having first and second opposed end surfaces, a pair of spaced side surfaces, a top surface and a bottom surface, said body comprising:
        a substrate of one conductivity type having top and bottom surfaces with the bottom surface being the bottom surface of the body;
        a first clad layer of the one conductivity type on the top surface of the substrate;
        a second clad layer of the one conductivity type on the first clad layer, the material of the second clad layer having a refractive index greater than that of the first clad layer;
        an active layer on said second clad layer and having a refractive index greater than that of the second clad layer, the active layer having a pair of ends at least one of which is spaced from at least one corresponding end surface of the body so that a portion of the second clad layer is between said at least one end of the active layer and the at least one corresponding end surface of the body; and
        a third clad layer on the active layer, said third clad layer being of the same material as the second clad layer but of a conductivity type opposite that of the second clad layer.

8. The diode of claim 7 in which the second clad layer is of a plurality of alternating layers of the material of the active layer and the first clad layer.

9. The diode of claim 7 including a fourth clad layer on the third clad layer, said fourth clad layer being of the same material as the first clad layer but of a conductivity type opposite that of the first clad layer, and the third clad layer extends across the at least one end of the active layer between the at least one end of the active layer and the at least one corresponding end surface of the body.

10. The diode of claim 9 wherein the active layer has a portion adjacent its end which is spaced from the corresponding end surface of the body which tapers in width to point at its end spaced from the second end of the body.

11. The diode of claim 10 wherein the portion of the active layer which tapers in width to a point also tapers in thickness to said point.

12. The diode of claim 11 in which both ends of the active layer are each spaced from the corresponding surfaces of the body, and each of the ends of the active layer tapers in width and thickness to a point.

13. The diode of claim 11 including a cap layer of a highly conductive semiconductor material of the same conductivity type as the fourth clad layer on the fourth clad layer.

14. The diode of claim 13 including a first contact layer of a conductive metal on and extending along the cap layer, and a second contact layer of a conductive metal on the bottom surface of the body.

15. The diode of claim 14 in which the first contact layer has a width smaller than a width of the active layer, the first contact layer extending over and along the active layer.

16. The diode of claim 15 including a pair of spaced, parallel grooves extending through the cap layer, the fourth clad layer and the third clad layer forming a mesa therebetween and the first contact layer is on the mesa.

17. The diode of claim 13 in which the cap layer extends along the fourth clad layer only over the length of the active layer.

18. The diode of claim 9 in which the second clad layer is of a plurality of alternating layers of the material of the first clad layer and the active layer.

19. The diode of claim 9 in which the second clad layer is of a plurality of alternating layers of the material of the first clad layer and of a layer of a semiconductor material having a refractive index less than that of the active layer but larger than that of the first clad layer.

20. The diode of claim 9 in which the second clad layer is of a plurality of alternating layers of materials having refractive indices between that of the first clad layer and that of the active layer.

21. The diode of claim 7 in which the active layer is at an angle different from 90° with respect to the end surfaces of the body.

22. A semiconductor electroluminescent diode having a first end surface and a second end surface, said diode comprising:

an active region having at least one end spaced from a corresponding end surface of the diode;

a first clad region disposed around the active region, said first clad region being disposed between the at least one end of the active region and the corresponding end surface of the diode; and a second clad region disposed adjacent to a first side of the first clad region and adjacent to a second side of the first clad region;

said first clad region having a first refractive index smaller than a second refractive index of the active region, said second clad region having a third refractive index less than the first refractive index and less than the second refractive index.

* * * * *